US005693408A

United States Patent [19]

Van Den Berg et al.

[11] Patent Number: 5,693,408
[45] Date of Patent: Dec. 2, 1997

[54] TOOL AND PROCESS FOR COATING A BASIC TOOL COMPONENT

[75] Inventors: Hendrikus Van Den Berg, Venlo-Blerick, Netherlands; Udo König, Essen; Ralf Tabersky, Bottrop, both of Germany

[73] Assignee: Widia GmbH, Essen, Germany

[21] Appl. No.: 446,836

[22] PCT Filed: Nov. 18, 1993

[86] PCT No.: PCT/DE93/01111

§ 371 Date: May 16, 1995

§ 102(e) Date: May 16, 1995

[87] PCT Pub. No.: WO94/12682

PCT Pub. Date: Jun. 9, 1994

[30] Foreign Application Priority Data

Nov. 21, 1992 [DE] Germany .................. 42 39 234.9

[51] Int. Cl.$^6$ .................................................. C23C 30/00
[52] U.S. Cl. .................. 428/212; 428/698; 428/699; 428/702; 427/249; 427/255.2; 427/255.7; 51/307; 51/309
[58] Field of Search ...................... 428/688, 689, 428/696, 698, 699, 702, 212; 427/249, 255.2, 255.7, 562, 564, 569, 573, 576, 585; 51/305, 307

[56] References Cited

U.S. PATENT DOCUMENTS

| | | | |
|---|---|---|---|
| 4,643,951 | 2/1987 | Keem | 428/469 |
| 4,746,563 | 5/1988 | Nakano | 428/216 |
| 4,943,450 | 7/1990 | Sarin | 427/255.2 |
| 5,077,091 | 12/1991 | Nowak et al. | 427/255.2 |
| 5,093,151 | 3/1992 | Van Den Berg | 427/39 |
| 5,223,337 | 6/1993 | Van Den Berg | 428/336 |
| 5,250,367 | 10/1993 | Santhanam et al. | 428/698 |
| 5,403,628 | 4/1995 | Konig | 427/569 |
| 5,496,594 | 3/1996 | Konig | 427/569 |

FOREIGN PATENT DOCUMENTS

| | | |
|---|---|---|
| 0 196 201 A1 | 10/1986 | European Pat. Off. . |
| 0 440 157 A1 | 8/1991 | European Pat. Off. . |
| 29 17 348 B1 | 10/1980 | Germany . |
| 35 44 975 C1 | 4/1987 | Germany . |
| 40 37 480 A1 | 5/1992 | Germany . |
| 59-25970 (A) | 2/1984 | Japan . |

*Primary Examiner*—Archene Turner
*Attorney, Agent, or Firm*—Herbert Dubno

[57] ABSTRACT

A process of forming a tool in which directly on the surface of the base body of the tool by base plasma activated chemical deposition a first PCVD layer of titanium carbide, titanium carbonitride, titanium nitride, zirconium carbonitride, and aluminum oxide is formed. Directly on this first layer by a nonplasma-activated CVD a second layer of titanium carbide, titanium carbonitride, titanium nitride, zirconium carbonitride, and aluminum oxide is formed. The steps are repeated to build up a coating so that it consists of a multiplicity of layers in a PCVD-CVD-PCVD-CVD structure.

20 Claims, No Drawings

TOOL AND PROCESS FOR COATING A BASIC TOOL COMPONENT

CROSS REFERENCE TO RELATED APPLICATIONS

This application is the US national phase of PCT application PCT/DE93/01111 filed 18 Nov. 1993 with a claim to the priority of German application P 42 39 234.9 filed 21 Nov. 1992.

FIELD OF THE INVENTION

The invention relates to a tool having a base body of hard metal, cermet, or steel and a multilayer surface coating applied to the base body of the hard materials titanium carbide, titanium carbonitride, titanium nitride, zirconium carbonitride, and/or aluminum oxide.

The invention further relates to a method of coating a base body of hard metal or cermet with several layers consisting of carbides, nitrides and/or carbonitrides of titanium and/or zirconium and/or aluminum oxide by means of a deposition process from the gas phase.

BACKGROUND OF THE INVENTION

The German publication "Angewandte Chemie" (69th year, no. 9, pages 281 through 312, 7 May 1957) describes how the brittleness of hard materials can be overcome by using them in the form of thin surface layers in order to protect other materials against mechanical or chemical attack. Thus for example a sheet coated with a 6 μm thick layer of TiN is described.

In addition a base body is for example known from Swiss patent 507,094 which consists of a hard-metal substrate and at least one hard-material layer, the hard-metal substrate being constituted of one or more hard materials and at least one binder metal, the hard-material layer containing hard carbides or nitrides. Such shaped bodies can be used as tools for chip-removing or noncutting shaping since they have good resistance to wear. The bodies can be made by the CVD (chemical vapor deposition) method as described for example in Swiss patent 452,205. The CVD process today is the most common coating method and is carried out by precipitating a surface layer onto a substrate from a reactive gas atmosphere which generally has a temperature between 900° C. and 1200° C. The gas atmosphere contains several compounds which react with one another at the reaction temperature and form the material in the surface layer. It is nowadays generally standard to sheath metallic substrates with hard-material layers of carbides, nitrides, or carbonitrides with the overall atmosphere containing halogenides of the elements from the group III to VI of the periodic table and including a nitrogen-containing compound and a carbon-containing compound. Thus a titanium-carbide layer is coated onto a hard-metal base body at about 1000° C. from a gas atmosphere which contains titanium tetrachloride and methane. As the carbon compounds, gaseous hydrocarbons are used while $N_2$, $NH_3$ or amines are used as the nitrogen-containing compounds.

In order to work at a low precipitating temperature the so-called plasma-assisted CVD process has been suggested. A nonequilibrium plasma is added to the reaction gas in a low-pressure glow discharge so that the charge carriers in the gas are accelerated by the created electrical field. The free path between successive collisions is dependent on the particle density and the pressure. When the particle energy reaches the applied voltage, molecules or atoms are excited to disassociation or ionization. Thus chemical reactions are possible which otherwise could only take place at relatively high temperatures. The low-pressure plasma can be produced mainly by applying a constant direct-current voltage to a workpiece as cathode, by means of a high-frequency alternating-current voltage, or by a pulsed direct-current voltage.

The high-frequency excitation, which adds its energy inductively or capacitatively from outside into the reaction vessel, is mainly used to deposit very pure layers in the electronics field, e.g. with microchips. Since it works without electrodes directly connected to the substrate there is no problem whether the workpiece is conductive or not. Disadvantageously this method is very expensive.

The simplest way to produce a low-pressure discharge is to connect the workpiece to be coated as a cathode and the receptacle or its walls as the anode or ground. The substrate temperature is thus a function of the voltage and current.

Furthermore the direct-current voltage can be pulsed so that the substrate temperature is a function of the peak voltage as well as of the peak current and also of the pulse duration and frequency. Preferably with this method the coating temperature can be set independently of the low-pressure discharge parameters, the voltage, and the current.

In WO 92/05009 and WO 92/05296 a cutting tool has already been proposed whose surface coating consists of several layers, the first layer being produced by the CVD method and the outer layers by the PVD method. The disadvantage of this method is that PVD and CVD layers must be applied in different installations which requires that the tools must be transferred after the CVD coating into another installation before the PVD layer can be applied. Thus, a reheating is necessary which leads to substantially increased energy costs for the production of the overall coating. Furthermore practical experience has shown that the maximum thickness of the overall coating is limited to 10 to 15 μm with the coatings of the prior art.

Japanese 59-25970 describes a coated hard-metal body whose coating is formed of several layers. The inner layer consists of one or two lamina of titanium carbide, titanium nitride or carbonitride, as well as SiC or $Si_3N_4$ and the outer layer of $Al_2O_3$. The layer underneath the $Al_2O_3$ layer is applied by CVD while the $Al_2O_3$ layer is applied either as a plasma CVD or CVD layer as amorphous $Al_2O_3$, or a mixed layer of amorphous $Al_2O_3$ and crystalline $Al_2O_3$ as well as a layer of crystalline $Al_2O_3$ are employed. This coating also has no adequate hold to the hard-metal substrate body.

OBJECTS OF THE INVENTION

It is therefore an object of the present invention to provide a tool of the above-described type which as a result of the physical characteristics of the individually applied layers either for itself alone or in combination with the conventional adjacent layers has a uniform wear-resistant surface coating which does not flake under load.

Another object of the invention is to provide a method of the above-described type by means of which it is possible to achieve a good overall thickness of the coating of up to 30 μm, if possible with advantageous growth speed of the individual layers.

DESCRIPTION OF THIS INVENTION

The objects are achieved with a tool wherein, according to the invention, a first individual layer is applied to the base body by a glow-discharge activated CVD (PCVD) method and the further layers are applied alternately by a thermal CVD method and a glow-discharge activated CVD (PCVD) method. Since the layers applied by the PCVD method have very fine particles and are tightly packed, the first layer is applied by the glow-discharge activated CVD method so that a diffusion barrier is created between the base body and the further surface layers. Experience has shown that because of the different layers formed on the one hand by CVD and on the other hand by PCVD a particularly dense and wear-resistant coating can be formed. Both the CVD and PCVD method also have fast growth rates so that the tool can be produced cost-efficiently due to the corresponding short coating times. The selected coating or layering process has considerable mechanical stability with surprisingly good resistance to bending (even with thick layers of more than 20 μm). In addition layers which are produced by PCVD have good growth characteristics for subsequent CVD layers which are particularly fine-grained and dense.

The overall thickness of the layers can be between 2 and 40 μm and/or each individual layer has a minimum thickness of 0.2 μm. Preferably the individual layers applied by the glow-discharge activated CVD method have, in addition to the elements titanium, zirconium, aluminum, carbon, nitrogen and/or oxygen, a halogen element in a concentration of 0.1 to 3% by weight.

It is also possible that individual layers applied alternately by the CVD and PCVD methods consist of the same hard materials, in particular titanium nitride, as well as that the individual layers consist of different hard materials. According to a further embodiment of the invention the individual layers applied by the CVD and PCVD methods consist of individual layers produced by the same method, namely packs of different hard materials, as for example TiN, Ti(C,N), TiC, Zr(C,N), $Al_2O_3$.

Preferably the layers applied by the PCVD method have a particle size that is smaller by at least a factor of two than the particle size of the layers applied by the CVD method. In particular the overall coating thickness is more than 15 μm.

The method of the invention has the advantage that high growth rates during layer formation as well as uniform fine-grained and dense individual layers can be made. In particular PCVD layers produce particularly good growth conditions for CVD layers which then have very fine particles and can be layered densely.

According to a particular embodiment of the invention a pulsed direct-current voltage is used with, in the space between pulses, a residual voltage of a level that is equal to or greater than the lowest ionization potential of the gases employed in the PCVD process with a cutting-insert base body connected as cathode. This residual direct-current voltage must not go above at most 50% of the maximal value of the pulsed direct-current voltage.

The pulsed direct-current voltage is as a rule a square-wave voltage with a maximum amplitude between 200 and 900 V and a period of between 20 μsec and 20 msec. Variations with formation of nonsquare rising and falling flanks as well as pointed waveforms are also usable as long as the retirement is met that between two maximum voltage values the voltage does not drop to zero but always lies above the lowest ionization potential of the gases employed in the PCVD process and below at most 50% of the maximal value of the pulsed direct-current voltage. According to a further feature of the invention a ratio of the pulse length (duration of the voltage signal of a pulse) to the period duration (pulse length+pulse pause length) is maintained at between 0.1 and 0.6. With deposition temperatures between 400° C. and 700° C. the layer growth rate lies between 0.5 to 10 μm/h.

Further teachings in this regard are described in German 38 41 731 A1 and European 0 373 412 A1 to which attention is directed.

Preferably the plasma CVD method is conducted at temperatures above 300° C. and pressures under 10,000 Pa in a cage completely surrounding the substrate body or bodies and a glow boundary is produced on the inner surface turned toward the substrate body, while a gas mixture intended to form the hard-material layer is conducted through the interior of the cage. In general thus the substrate body to be coated forms the center of the cage. In particular this center is surrounded by a spherically-symmetrical glow boundary. The cage also avoids a preferential flow direction of the reacting gas or a preferential local region of deposition of the reaction products as a coating. The cage structure solves the problems of distributing the reaction gases over the entire interior of the cage uniformly.

The substrate body can either be held in the cage electrically insulated and free of voltage or connected electrically conductively with the reactor (container) functioning as anode in such a manner that the substrate and the reactor container are at ground potential. A further possibility is that the substrate body is electrically conductively connected with the voltage source creating the glow boundary on the cage, that is the substrate is at the cathode potential (of the cage).

According to a further variant of the invention a second voltage source independent of the voltage source of the cage can be connected to the substrate body and produce a potential independent of the cage potential.

Preferably the glow discharge is produced on the inner surface of the cage by a pulsed direct current which in particular has the characteristics described in German patent document 3,841,731. The substrate body is heated to a temperature of at most 1100° C., preferably the temperature is about between 400° to 600° C. The pressure is set in the reaction vessel between 100 Pa and 1000 Pa.

The standard CVD method is known in principle from the state of the art and is carried out at substrate temperatures of 900° C. and above. See literature in which the CVD process is described, for example WO 92/05009.

According to a further embodiment of the invention the individual layers are applied in one heat without intervening cooling. Preferably the above described tools or the objects produced according to the invention are used as cutting inserts for turning, milling, boring and cutting threads.

An embodiment of the invention is described in the following.

To coat indexable cutting plates which are used to turn steel parts, 400 indexable cutting plates of the CNMG120412 (identification DIN 4987) are loaded into a coating oven that is set up for carrying out the CVD method and also the PCVD method. The indexable cutting plates are surrounded by a cage-like construction and can also be connected as cathodes. After heating to 780° C. the plasma-chemical process for precipitating titanium nitride is set in operation. Then the following coating parameters are set (PCVD step):

| | |
|---|---|
| Temperature | 780° C. |
| Pressure of the reactive gas atmosphere | 3 mbar |
| Gas mixture | 1.5% TiCl$_4$, 11.5% N$_2$, 8% Ar, 79% H$_2$ |
| Maximum pulse voltage | 580 V |
| Duration of the current pulse: | 75 μsec |
| Duration of the pause: | variable from 110 to 150 μsec |

Average residual voltage between current pulses about 20 V.

The temperature is controlled very precisely during the entire length of the pulse pause. Fast electronic control increases the time of the pulse pauses during temperature increase or lowers it as the temperature drops. After 90 min this process is ended and the temperature is increased by an external heater. Thereafter the CVD plating step is initiated with the following values set:

| | |
|---|---|
| Temperature | 940° C. |
| Pressure of the reactive gas atmosphere | 250 mbar |
| Gas mixture | 2.5% TiCl$_4$, 34% N$_2$, 62.5% H$_2$. |

After a time of 120 min this process is ended. Then the above-given parameters for the PCVD step are set and a PCVD plating is carried out. In general the PCVD and CVD process steps are conducted three times in succession, one after the other. The outermost individual layer is thus a TiN layer produced by CVD. After cooling and opening of the oven samples are taken out of various regions and carefully examined. Metallographic precision sections show that the coating is formed of six layers. The CVD layers have a somewhat different color shading than the PCVD layers although all the layers are formed by TiN (basic color yellow). This can be ascribed to the different particle structure of the CVD and PCVD layers. A thorough examination with a scanning electron microscope shows that the average particle size of the PCVD layers is smaller by a factor of at least two than that of the CVD layers. The color differences between the CVD and PCVD layers allows one to measure the partial layer thicknesses. In the center the thicknesses of the CVD layers is about 5 μm and that of the PCVD layers about 3 μm. In general the overall coating thickness of the samples is between 22 and 27 μm. Laboratory tests with the use of a diamond-equipped scratch tester show an extraordinary mechanical stability of the coating.

Other indexable cutting plates from the described coating test were tested in industrial manufacturing. For example forged axle pins 220 mm long and with a maximum diameter of 85 mm of 1.1213 steel with a tensile strength of 700 to 800 N/mm$^2$ were machined. When turning the parts on an automatic lathe the following working parameters were used: cutting depth 2 to 3 mm, advance 0.45 mm/rotation, and cutting speed 250 to 270 m/min. The variation range of these data are caused by the conical shape of the parts being machined. With this process up to now indexable cutting plates were used of the type CNMG120412 of a hard metal of the machining-use type P15 (identified as DIN/ISO 4990) which has three CVD layers of titanium carbide, titanium carbonitride, and titanium nitride. The overall thickness of this coating was about 12 μm. In this arrangement each indexable cutting plate could machine 220 to 230 workpieces before replacement was necessary. Earlier tests to increase the resistance to wear of these CVD-plated indexable cutting plates by increasing the coating thickness did not succeed since with indexable cutting plates having very thick CVD coatings (coating thickness about 18 to 20 μm) the cutting edges chipped under the stress of the cutting process. Only the use of a indexable cutting plate as described above according to the invention with a layer about 24 μm thick could substantially increase the production results. After machining 200 workpieces there were no chips or damage on the cutting edges. The indexable cutting plates according to the invention reached the end of their service life after machining from 480 to 530 parts.

We claim:

1. A process of forming a tool, comprising the steps of:
   a) depositing directly on a surface of a base body of a tool by plasma-activated chemical vapor deposition a first PCVD layer consisting of at least one compound selected from the group which consists of titanium carbide, titanium carbonitride, titanium nitride, zirconium carbonitride and aluminum oxide and consisting essentially of elements selected from the group which consists of titanium, zirconium, aluminum, carbon, nitrogen, oxygen and halogen;
   b) depositing directly on said first PCVD layer by nonplasma-activated chemical vapor deposition a second layer of at least one compound selected from the group which consists of titanium carbide, titanium carbonitride, titanium nitride, zirconium carbonitride and aluminum oxide and consisting essentially of elements selected from the group which consists of titanium, zirconium, aluminum, carbon, nitrogen, oxygen and halogen; and
   c) repeating steps a) and b) alternately to build up a coating on said base body consisting of a multiplicity of layers forming a structure consisting of PCVD-CVD-PCVD-CVD-layers in sequence.

2. The process defined in claim 1 wherein the first and second layers deposited in the steps (a) and (b) contain different compounds.

3. The process defined in claim 1 wherein the first and second layers deposited in steps (a) and (b) contain the same compound.

4. The process defined in claim 1 wherein said first layer deposited in the step (a) by plasma-assisted chemical vapor deposition has a particle size less than half the particle size of the second layer deposited in step (b) by nonplasma-activated chemical vapor deposition.

5. The process defined in claim 1 wherein the coating is from 2 to 40 μm thick, each individual layer having a respective thickness in excess of 0.2 μm.

6. The process defined in claim 1 wherein step (a) includes the step of applying a pulsed direct-current voltage to said body functioning as a cathode.

7. The process defined in claim 6 wherein the pulsed current voltage is maintained at 200 to 900 V.

8. The process defined in claim 6 wherein the step of applying the pulsed direct-current voltage includes the step of applying a residual voltage between successive pulses, said residual voltage being at least equal to a lowest ionization potential of the gases used plasma-activated in the chemical vapor deposition but not exceeding 50% of a maximum value of said pulsed direct-current voltage.

9. The process defined in claim 6 wherein the step of applying the pulsed direct-current voltage has a period between successive impulses ranging from 20 microsec to 20 millisec.

10. The process defined in claim 9 wherein the ratio of the duration of pulse to the duration of a pulse plus the duration of an interval between pulses is 0.1 to 0.6.

11. The process defined in claim 1, further comprising, during the plasma-activated chemical vapor deposition, the steps of:

enclosing said body in a cage formed with an inner surface facing said body;

electrically insulating said body in said cage;

producing a glow discharge on said inner surface at a temperature above 300° C. and a pressure under 10,000 Pa, and supplying a gas mixture through said cage.

12. The process defined in claim 11, further comprising the step of electrically conductively connecting said body with a reaction vessel functioning as an anode.

13. The process defined in claim 11, further comprising the step of electrically conductively connecting said body with a voltage source generating said glow discharge.

14. The process defined in claim 11, further comprising the step of electrically conductively connecting said body with a voltage source independent from a voltage source generating said glow discharge.

15. The process defined in claim 11 wherein said step of producing the glow discharge utilizes a pulsed direct-current voltage.

16. The process defined in claim 11 wherein step (a) is conducted at a temperature ranging from 400° C. to 900° C.

17. The process defined in claim 16 wherein step (a) is conducted under a temperature ranging from 600° C. to 800° C.

18. The process defined in claim 12, further comprising the step of generating a pressure in said reaction vessel ranging from 100 Pa to 1000 Pa.

19. The process defined in claim 1 wherein said step (b) follows the step (a) without cooling said body.

20. A tool made by the process of claim 1.

* * * * *